(12) United States Patent
Miyamoto

(10) Patent No.: US 7,180,748 B2
(45) Date of Patent: Feb. 20, 2007

(54) FRONT PANEL FITTING APPARATUS

(75) Inventor: Takashi Miyamoto, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 136 days.

(21) Appl. No.: 11/097,307

(22) Filed: Apr. 4, 2005

(65) Prior Publication Data

US 2006/0012272 A1 Jan. 19, 2006

(30) Foreign Application Priority Data

Apr. 5, 2004 (JP) ............................. 2004-110950

(51) Int. Cl.
G06F 1/16 (2006.01)
(52) U.S. Cl. .................... 361/725; 312/223.2
(58) Field of Classification Search .................. 361/725
See application file for complete search history.

(56) References Cited

U.S. PATENT DOCUMENTS

| 5,423,605 | A | * | 6/1995 | Liu | 312/265.6 |
| 5,918,956 | A | * | 7/1999 | Scholder | 312/223.2 |
| 6,102,501 | A | * | 8/2000 | Chen et al. | 312/223.2 |
| 6,671,179 | B2 | * | 12/2003 | Chen | 361/725 |
| 6,903,937 | B2 | * | 6/2005 | Watanabe | 361/752 |
| 2005/0062372 | A1 | * | 3/2005 | Mukougawa | 312/223.1 |

FOREIGN PATENT DOCUMENTS

JP 3064733 1/2000

* cited by examiner

Primary Examiner—Lynn Feild
Assistant Examiner—Anthony Q. Edwards
(74) Attorney, Agent, or Firm—Bacon & Thomas, PLLC

(57) ABSTRACT

The present invention provides a front panel fitting apparatus capable of fitting and removing a front panel quickly and easily with a small force. A pair of left and right leg parts 4 provided on the underside of a front panel 2 have respectively: leg bottom plates 4a formed integrally with the front panel 2 and extending to under a bottom chassis 1; and leg edge plates 4b formed integrally with the respective leg bottom plates 4a from the front edge through the both side edges thereof, a pair of slits 20 being formed at a predetermined spacing forward from the central part of the rear edge of each of the leg bottom plates 4a, an engaging hole 8 being formed in an elastically deformable tongue piece 21 left between the both slits 20, engaging convex portions 9 being provided at positions of the bottom chassis 1 opposing the respective engaging holes 8 in a protruding manner, and the front panel fitting apparatus being adapted in such a manner that the upper edge part of the front panel 2 is engaged with a projecting portion on a crossbeam installed on the front side or in the upper front part of the bottom chassis 1, and then the front panel 2 is rotated downward centering on the projecting portion to engage the engaging holes 8 with the respective engaging convex portions 9.

5 Claims, 11 Drawing Sheets

FRONT PANEL FITTING APPARATUS

CROSS-REFERENCE TO RELATED APPLICATIONS

This application claims, under 35 USC 119, priority of Japanese Application No. 2004-110950 filed Apr. 5, 2004.

BACKGROUND OF THE INVENTION

1. Field of the Invention

The present invention relates to a front panel fitting apparatus adapted to fit/remove a front panel of, for example, a DVD+RW player to/from a bottom chassis.

2. Description of the Prior Art

In FIGS. 8 to 12 is shown an example of conventional disk players (refer to Japanese Registered Utility Model No. 3064733 for example), in which a plastic front panel 2 is arranged in a front opening portion of a metal-plate bottom chassis 1 having a DVD (not shown in the figures) inside thereof and a top chassis 3 is arranged in an upper opening portion of the bottom chassis 1, and in which a pair of left and right leg parts 4 provided on either side of the underside of the front panel 2 have respectively: leg bottom plates 4a formed integrally with the front panel 2 and extending to under the bottom chassis 1; substantially U-shaped leg edge plates 4b formed integrally with the respective leg bottom plates 4a from the front edge through the both side edges thereof, and leg longitudinal plates 4c and leg lateral plates 4d formed integrally with the respective leg bottom plates 4a in a branching manner from the respective leg edge plates 4b, rubber bottom plates 6 being applied to the undersurface of the respective leg parts 4 adhesively, engaging holes 8 being formed, respectively, in a pair of left and right wing plates 7 formed integrally with the corner part between the leg parts 4 and the front panel 2, and substantially triangle engaging convex portions 9 being provided at positions opposing the respective engaging holes 8 in a protruding manner by pressing the bottom chassis 1.

Also, an engaging hole 11 is formed in a central part bottom plate 10 provided in a protruding manner integrally with the front panel 2 in the central part thereof and extending to under the bottom chassis 1, a substantially triangle engaging convex portion 12 being provided at a position opposing the engaging hole 11 in a protruding manner by pressing the bottom chassis 1. It is noted that the numerals 13, 14 and 15 indicate, respectively, an opening and closing cover for DVD, a power button, and an operation button.

The fitting process for the front panel 2 will then be described. As shown by virtual lines in FIGS. 11 and 12, a connecting hole 17 in a projecting piece 2a, which extends rearward from the upper edge part of the front panel 2, is engaged with a projecting portion 18 on a crossbeam 1a installed on the front side or in the upper front part of the bottom chassis 1, and then the front panel 2 is rotated downward (indicated by an arrow "a") centering on the projecting portion 18 to displace each of the leg parts 4 and the wing plates 7 and the central part bottom plate 10 elastically outward (indicated by an arrow "b"), which allows the engaging holes 8 and 11 to be engaged with the respective engaging convex portions 9 and 12 to fit the front panel 2 to the front opening portion of the bottom chassis 1, as shown by solid lines in FIGS. 11 and 12.

In the conventional arrangement as described above, the leg parts 4 have a relatively large rigid structure, which requires excessive force to displace each of the leg parts 4 and the wing plates 7 elastically outward (indicated by the arrow "b") to fit/remove the front panel 2 to/from the bottom chassis 1, resulting in a lot of trouble and time fitting and removing them.

SUMMARY OF THE INVENTION

The present invention has been made in consideration of the above-described conventional defects, and an object thereof is to provide a front panel fitting apparatus capable of fitting and removing a front panel quickly and easily with a small force.

In order to achieve the above-described object, the invention according to claim 1 is characterized by a front panel fitting apparatus in which a pair of left and right leg parts, which are provided on either side of the underside of a plastic front panel that is arranged in a front opening portion of a bottom chassis having an electrical apparatus inside thereof, have respectively: leg bottom plates formed integrally with the front panel and extending to under the bottom chassis; and leg edge plates formed integrally with the respective leg bottom plates from the front edge through the both side edges thereof, a pair of left and right engaging holes being formed on the underside of the front panel, engaging convex portions being provided at positions of the bottom chassis opposing the respective engaging holes in a protruding manner, the front panel fitting apparatus being adapted in such a manner that the upper edge part of the front panel is engaged with a projecting portion on a crossbeam installed on the front side or in the upper front part of the bottom chassis, and then the front panel is rotated downward centering on the projecting portion to engage the engaging holes with the respective engaging convex portions, wherein a pair of slits are formed at a predetermined spacing forward from the central part of the rear edge of each of the leg bottom plates and an engaging hole is formed in an elastically deformable tongue piece left between the both slits, the rear edge of the tongue piece being retracted forward relative to the rear edge of each of the leg bottom plates by a predetermined spacing, and the upper angled portion of the rear edge of the tongue piece being clipped to form a concave groove.

The invention according to claim 2 is characterized by a front panel fitting apparatus in which a pair of left and right engaging holes are formed on the underside of a plastic front panel that is arranged in a front opening portion of a bottom chassis having an electrical apparatus inside thereof and engaging convex portions are provided at positions of the bottom chassis opposing the respective engaging holes in a protruding manner, the front panel fitting apparatus being adapted in such a manner that the upper edge part of the front panel is engaged with a projecting portion on a crossbeam installed on the front side or in the upper front part of the bottom chassis, and then the front panel is rotated downward centering on the projecting portion to engage the engaging holes with the respective engaging convex portions, wherein a pair of left and right leg parts provided on the underside of the front panel have respectively: leg bottom plates formed integrally with the front panel and extending to under the bottom chassis; and leg edge plates formed integrally with the respective leg bottom plates from the front edge through the both side edges thereof, a pair of slits being formed at a predetermined spacing forward from the central part of the rear edge of each of the leg bottom plates, and an engaging hole being formed in an elastically deformable tongue piece left between the both slits.

The invention according to claim 3 is characterized in that the rear edge of the tongue piece of the invention according to claim 2 is retracted forward relative to the rear edge of each of the leg bottom plates by a predetermined spacing.

The invention according to claim 4 is characterized in that the upper angled portion of the rear edge of the tongue piece of the invention according to claim 2 or 3 is clipped to form a concave groove.

In the invention according to claim 1, which corresponds to an embodiment (refer to FIGS. 1 to 7), the tongue pieces of the front panel are displaced elastically outward to engage the engaging holes of the tongue pieces with the respective engaging convex portions of the bottom chassis and thereby to fit the front panel to the front opening portion of the bottom chassis, each of the tongue pieces being left between a pair of slits formed at a predetermined spacing forward from the central part of the rear edge of each of the leg bottom plates, which allows the front panel to be fitted and removed quickly and easily by displacing not the leg parts but only the tongue pieces elastically with a relatively small force.

Also, the rear edges of the tongue pieces are retracted forward relative to the rear edges of the leg bottom plates by a predetermined spacing to bring the tongue pieces within the respective leg parts, and therefore in the case, for example, of an accidental collision between the leg parts and any equipment in an assembly process, it is possible to protect the tongue pieces from damage.

Further, the upper angled portions of the rear edges of the tongue pieces are clipped to form a concave groove, which makes it easy to displace the tongue pieces elastically by inserting the tip of a tool such as screwdriver into the concave groove to remove the engaging holes from the engaging convex portions easily.

In the invention according to claim 2, which indicates a fundamental configuration, the tongue pieces of the front panel are displaced elastically outward to engage the engaging holes of the tongue pieces with the respective engaging convex portions of the bottom chassis and thereby to fit the front panel to the front opening portion of the bottom chassis, each of the tongue pieces being left between a pair of slits formed at a predetermined spacing forward from the central part of the rear edge of each of the leg bottom plates, which allows the front panel to be fitted and removed quickly and easily by displacing not the leg parts but only the tongue pieces elastically with a relatively small force.

In the invention according to claim 3, the rear edges of the tongue pieces are retracted forward relative to the rear edges of the leg bottom plates by a predetermined spacing to bring the tongue pieces within the respective leg parts, and therefore in the case, for example, of an accidental collision between the leg parts and any equipment in an assembly process, it is possible to protect the tongue pieces from damage.

In the invention according to claim 4, the upper angled portions of the rear edges of the tongue pieces are clipped to form a concave groove, which makes it easy to displace the tongue pieces elastically by inserting the tip of a tool such as screwdriver into the concave groove to remove the engaging holes from the engaging convex portions easily.

DESCRIPTION OF THE PREFERRED EMBODIMENTS

Figure 1:
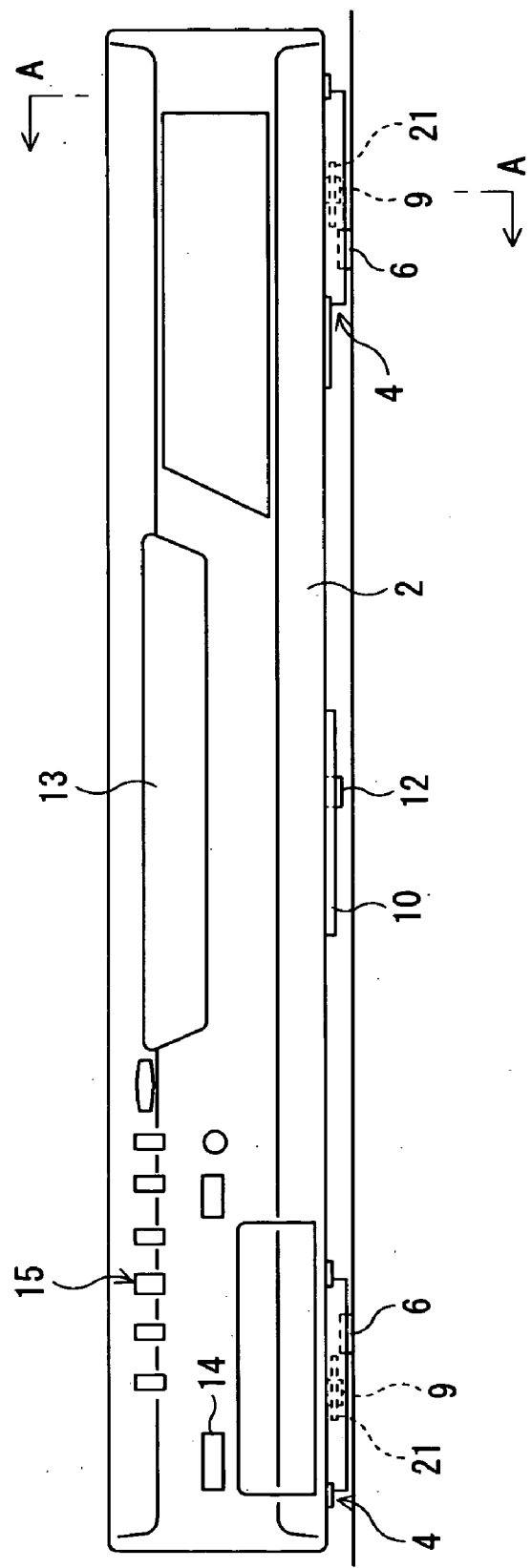
FIG. 1 is a front elevational view showing an embodiment of the present invention.
Figure 2:
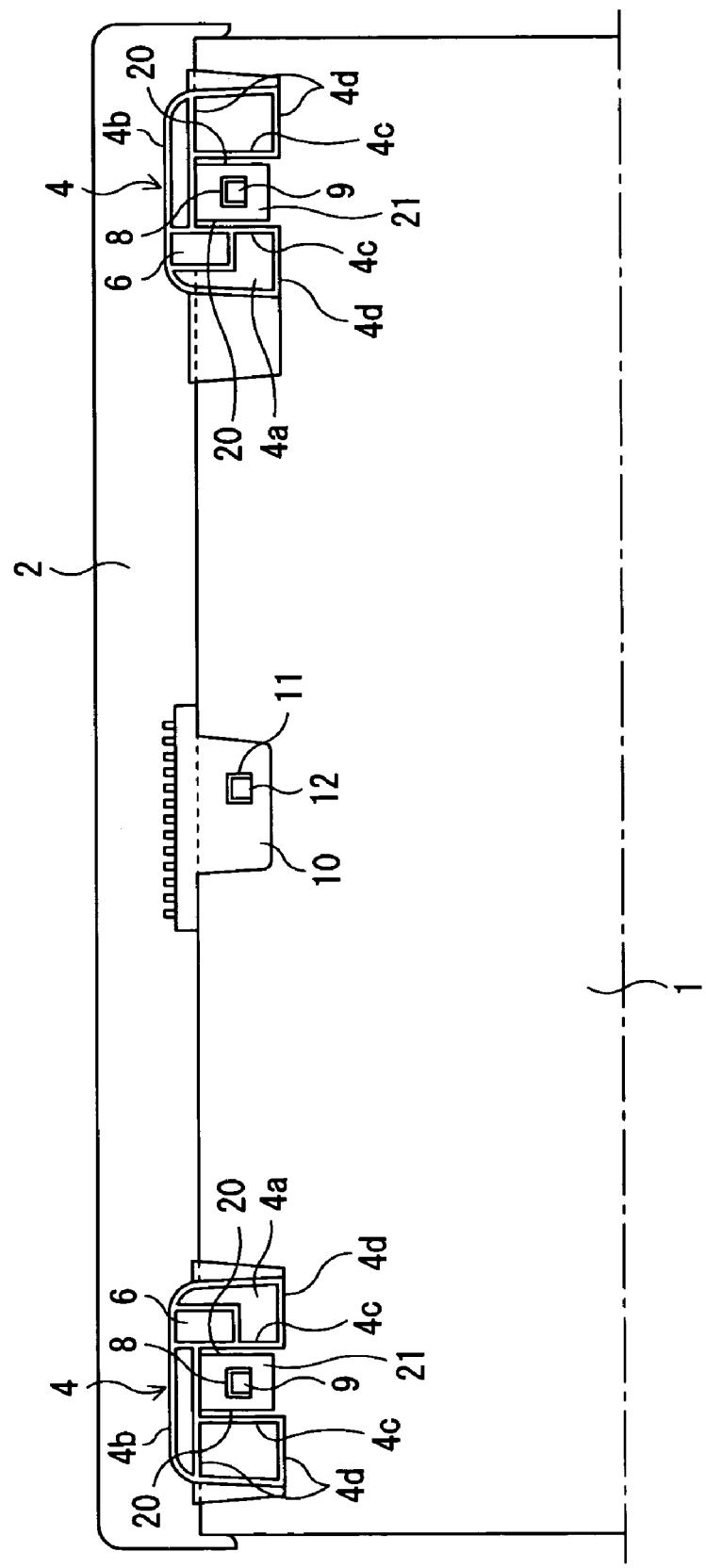
FIG. 2 is a bottom plan view showing the embodiment of the present invention.
Figure 3:
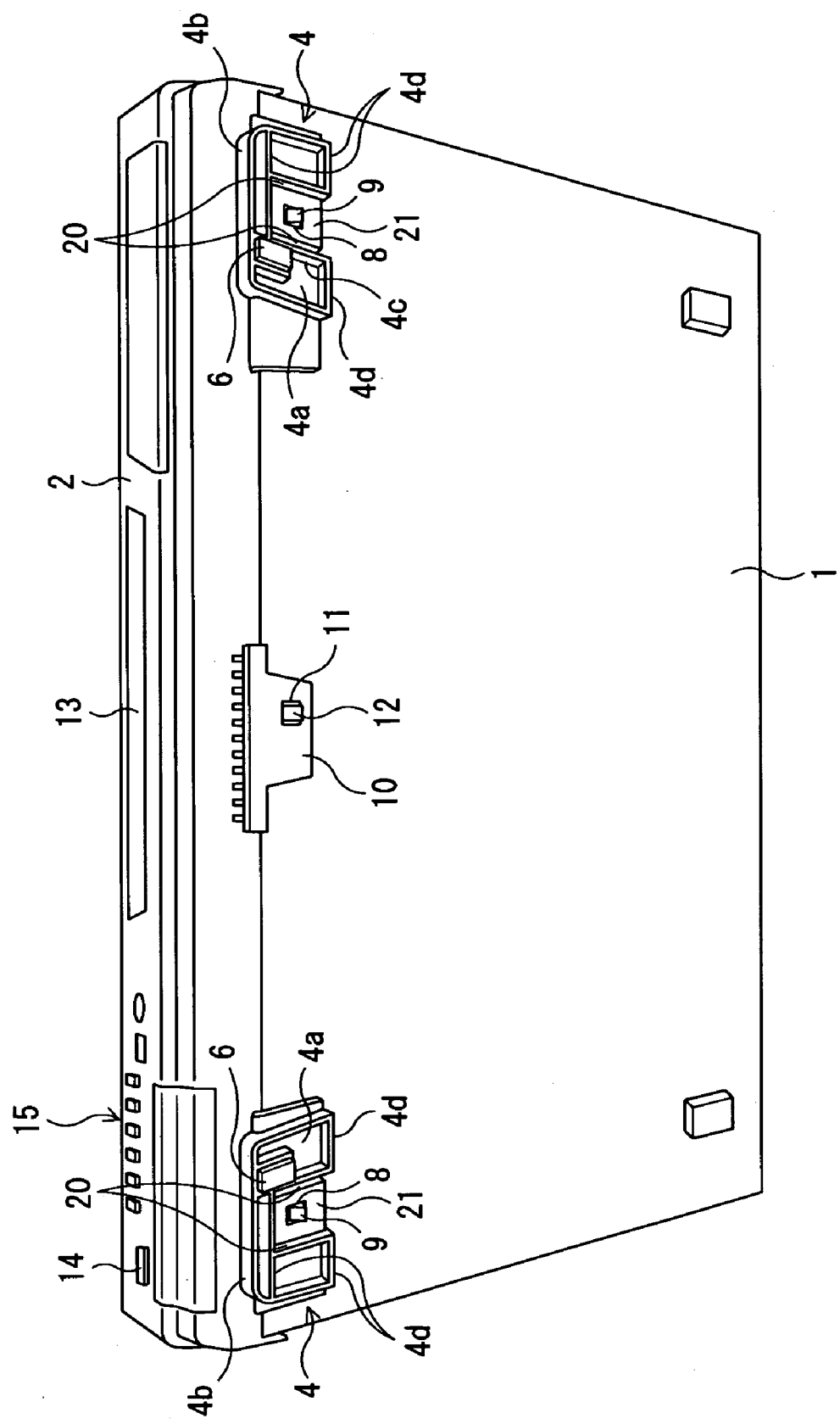
FIG. 3 is a perspective view showing the embodiment of the present invention.

FIGS. 1 to 7 shows an embodiment of a front panel fitting apparatus in accordance with the present invention, in which a pair of slits 20 are formed at a predetermined spacing forward from the central part of the rear edge of each of leg bottom plates 4a and an engaging hole 8 is formed in an elastically deformable tongue piece 21 left between the both slits 20, the rear edge of the tongue piece 21 being retracted forward relative to the rear edge of each of the leg bottom plates 4a by a predetermined spacing "a", and the upper angled portion of the rear edge of the tongue piece 21 being clipped to form a concave groove 22. The arrangement other than above is almost the same as that shown in FIGS. 8 to 12, and therefore same elements are designated with the same numeral references to omit the description thereof.

The fitting process for the front panel 2 will then be described. As shown by virtual lines in FIG. 4 (as well as in FIG. 11), a connecting hole 17 in a projecting piece 2a, which extends rearward from the upper edge part of the front panel 2, is engaged with a projecting portion 18 on a crossbeam 1a installed on the front side or in the upper front part of the bottom chassis 1, and then the front panel 2 is rotated downward (indicated by an arrow "a") centering on the projecting portion 18 to displace the tongue pieces 21 and a central part bottom plate 10 elastically outward (indicated by an arrow "b"), which allows the engaging holes 8 and 11 to be engaged with respective engaging convex portions 9 and 12 to fit the front panel 2 to the front opening portion of the bottom chassis 1, as shown by solid lines in FIG. 4 (as well as in FIG. 11).

In accordance with the arrangement above, the tongue pieces 21 of the front panel 2 are displaced elastically outward (indicated by the arrow "b") to engage the engaging holes 8 of the tongue pieces 21 with the respective engaging convex portions 9 of the bottom chassis 1 and thereby to fit the front panel 2 to the front opening portion of the bottom chassis 1, each of the tongue pieces 21 being left between a pair of slits 20 formed at a predetermined spacing forward from the central part of the rear edge of each of the leg bottom plates 4a, which allows the front panel 2 to be fitted and removed quickly and easily by displacing not the leg parts 4 but only the tongue pieces 21 elastically with a relatively small force.

Also, the rear edges of the tongue pieces 21 are retracted forward relative to the rear edges of the leg bottom plates 4a by a predetermined spacing "a" to bring the tongue pieces 21 within the respective leg parts 4, and therefore in the case, for example, of an accidental collision between the leg parts 4 and any equipment in an assembly process, it is possible to protect the tongue pieces 21 from damage.

Figure 4:
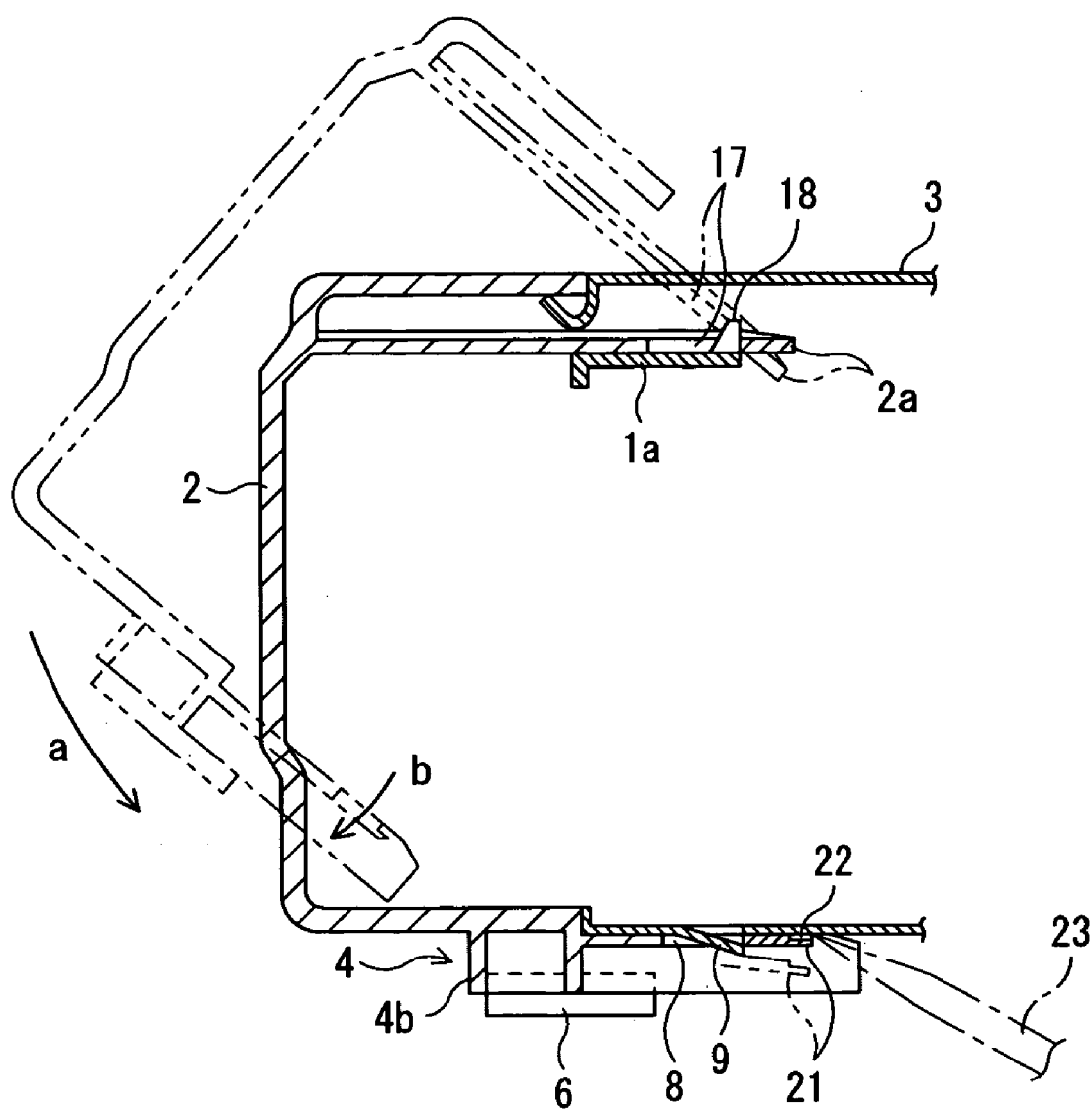
FIG. 4 is a view on arrow A—A in FIG. 1.
Figure 5:
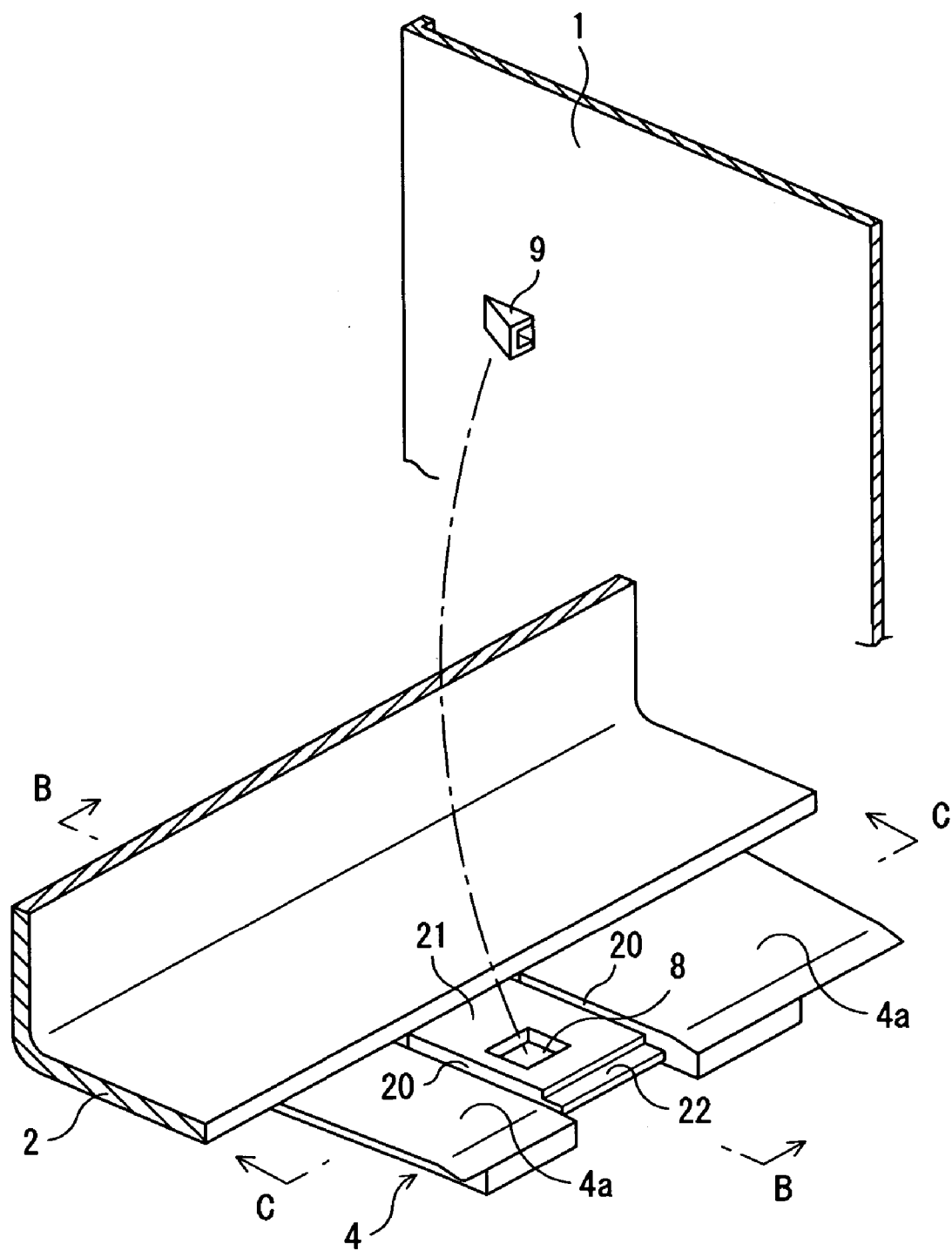
FIG. 5 is an exploded perspective view of a substantial part in FIG. 1.
Figure 6:
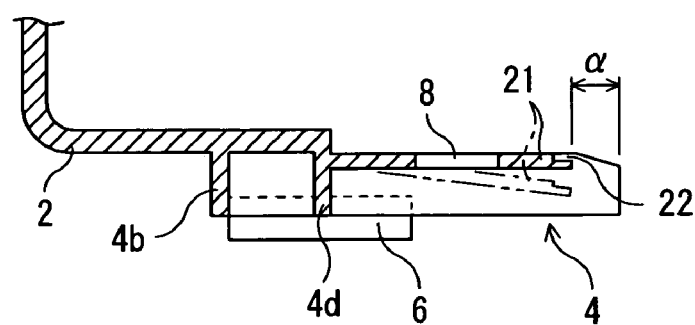
FIG. 6 is a view on arrow B—B in FIG. 5.
Figure 7:
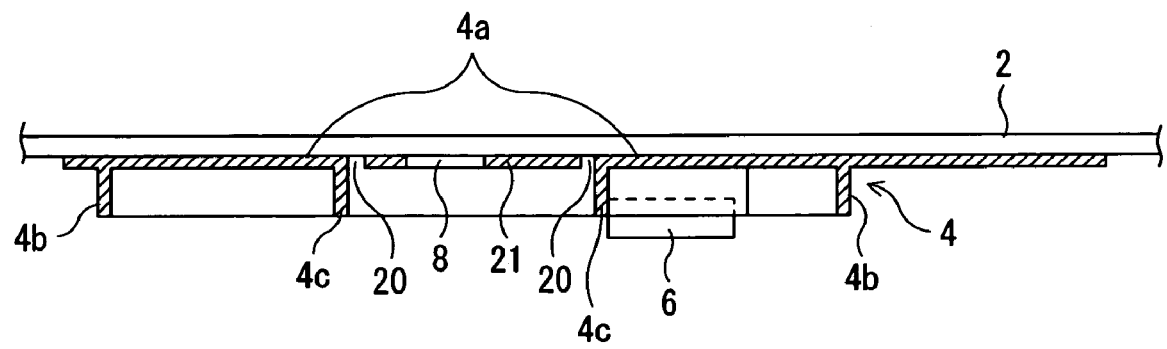
FIG. 7 is a view on arrow C—C in FIG. 5.
Figure 8:
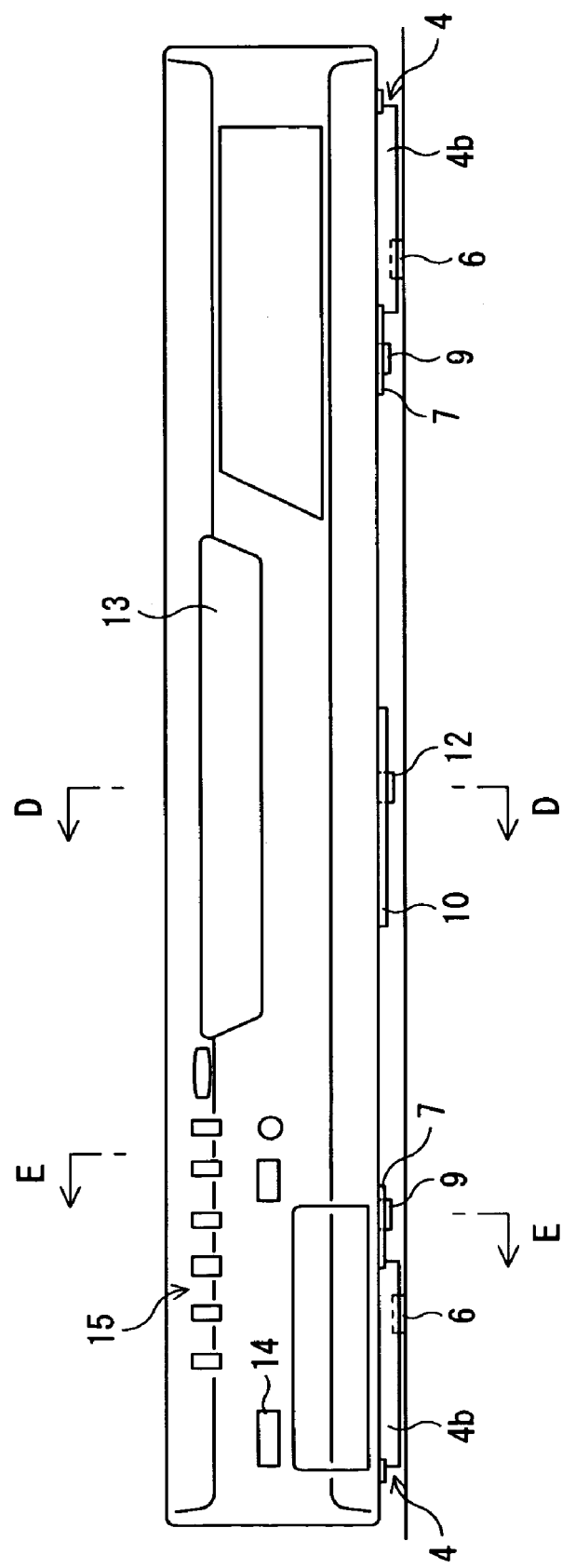
FIG. 8 is a front elevational view showing a prior art example.
Figure 9:
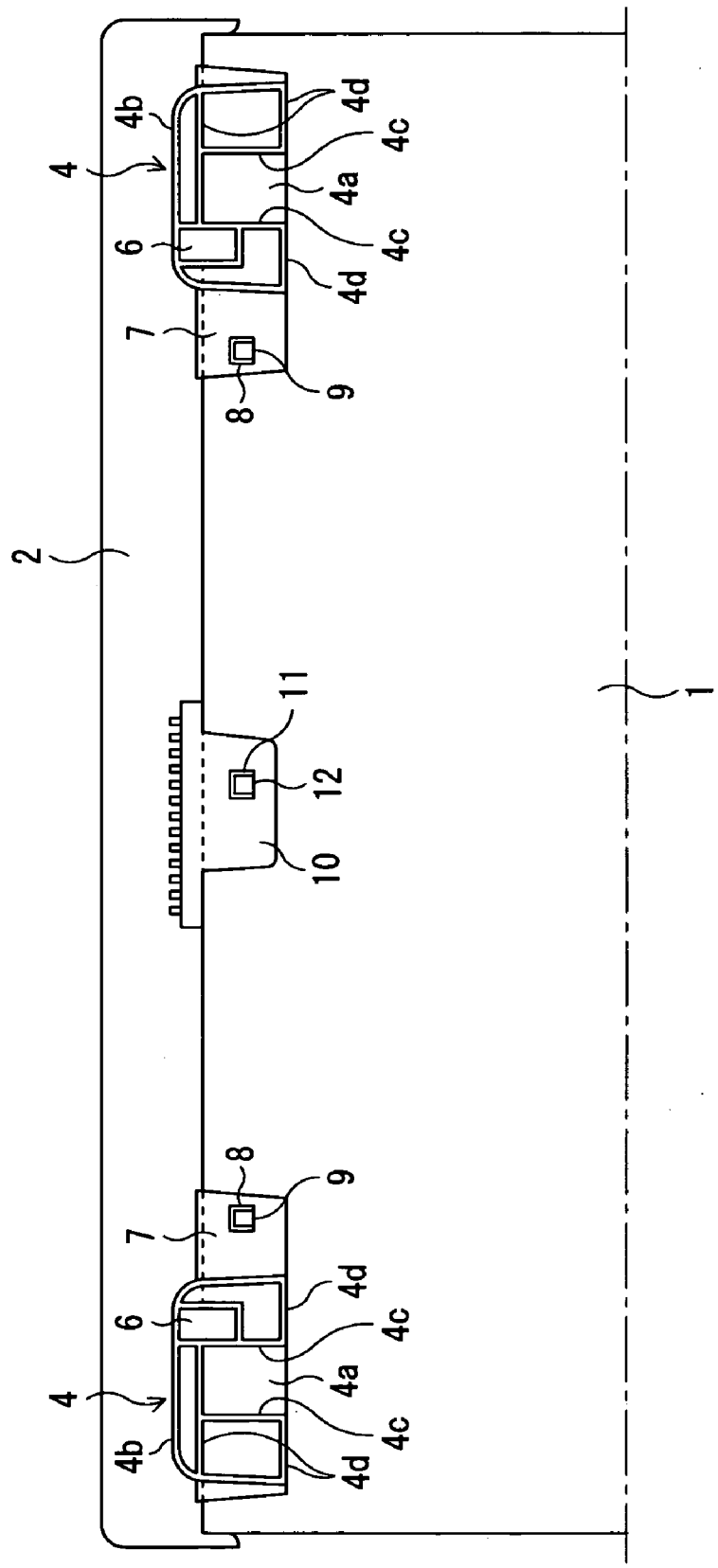
FIG. 9 is a bottom plan view showing the prior art example.
Figure 10:
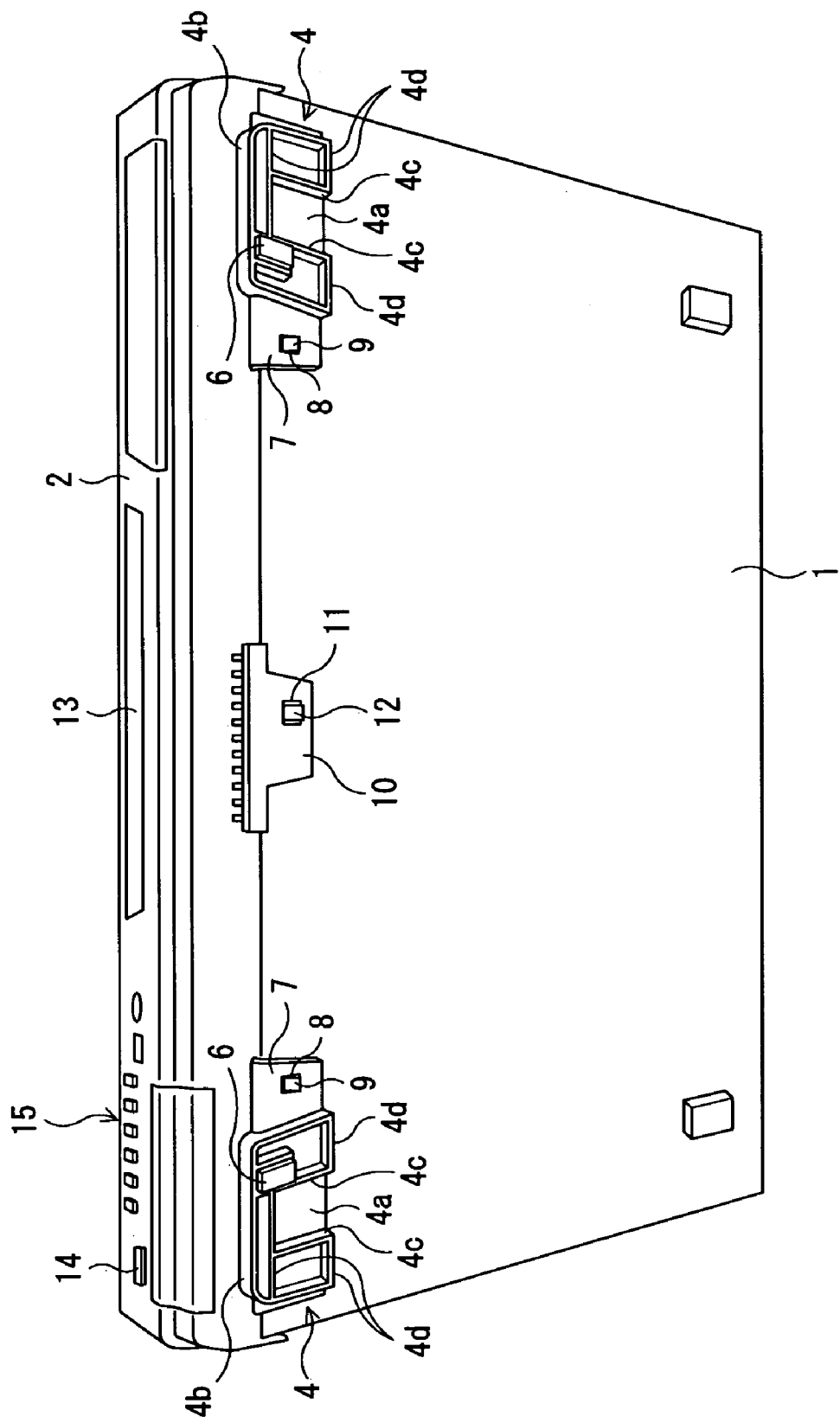
FIG. 10 is a perspective view showing the prior art example.
Figure 11:
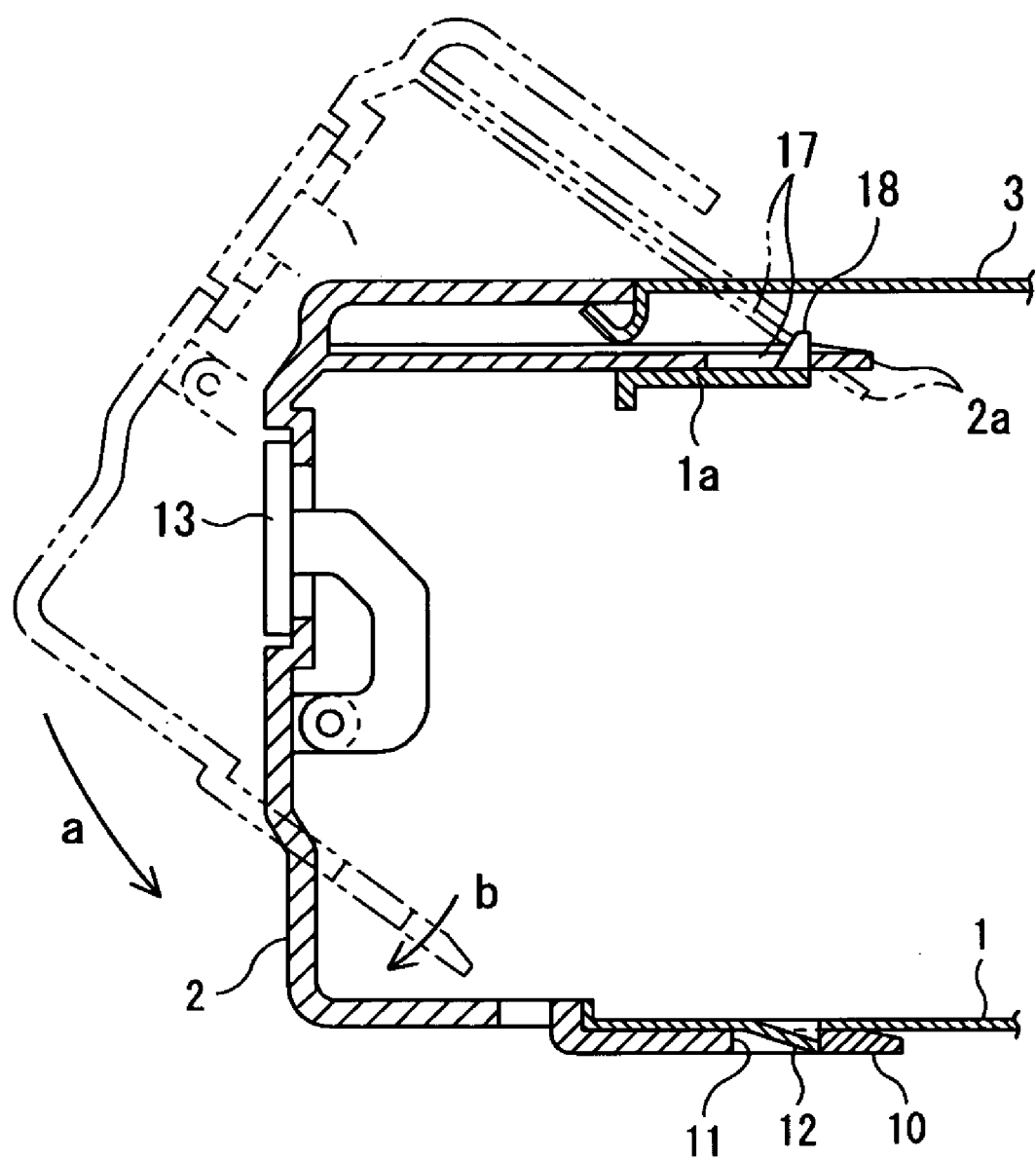
FIG. 11 is a view on arrow D—D in FIG. 8.
Figure 12:
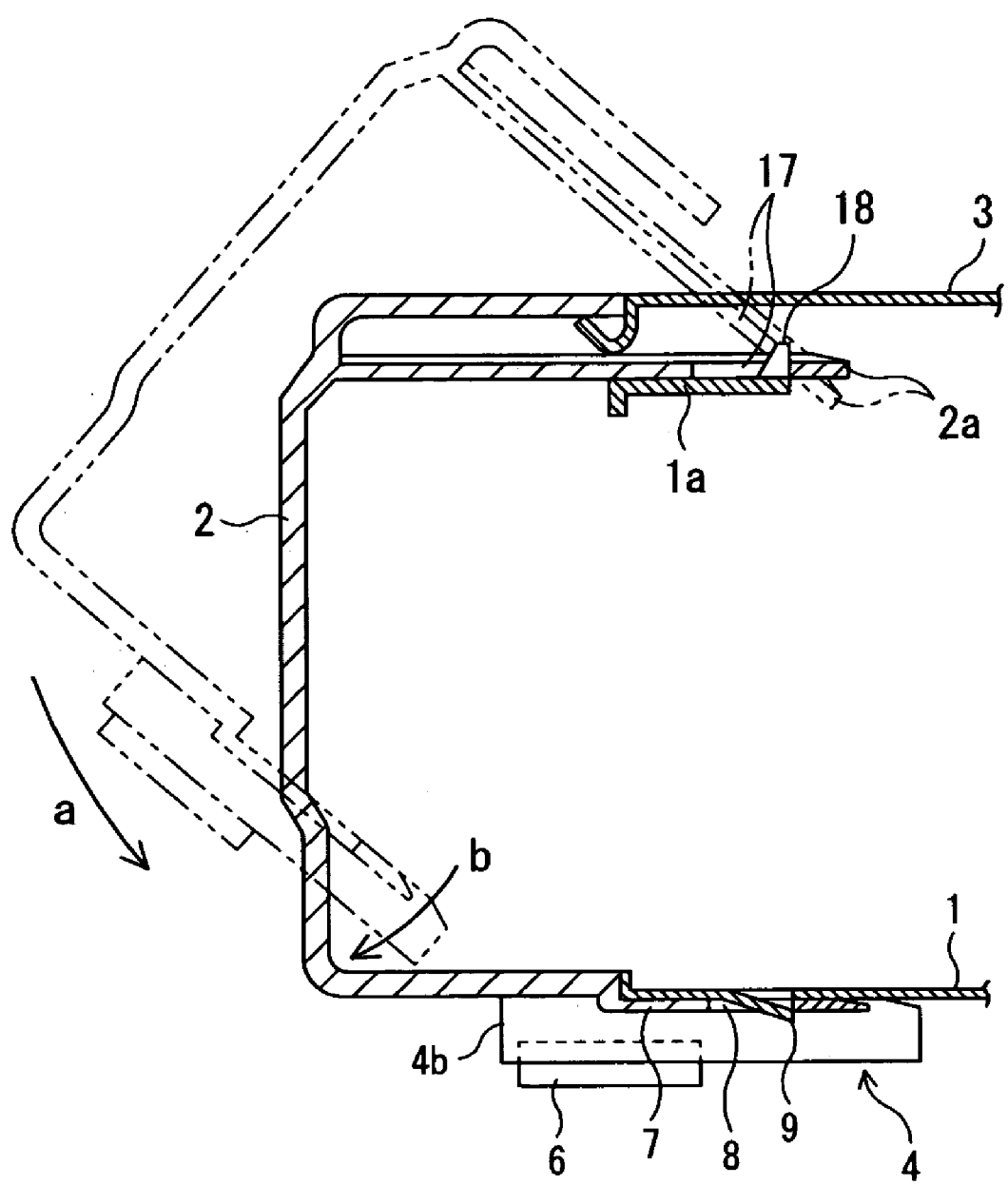
FIG. 12 is a view on arrow E—E in FIG. 8.

Further as shown in FIG. 4, the upper angled portions of the rear edges of the tongue pieces 21 are clipped to form a concave groove 22, which makes it easy to displace the tongue pieces 21 elastically by inserting the tip of a tool 23 such as screwdriver into the concave groove 22 to remove the engaging holes 8 from the engaging convex portions 9 easily.

In the foregoing embodiment, the description has been made for a DVD+RW player as an example, but should not be restricted thereto and also applicable to various kinds of electrical apparatuses such as DVD integrated video cassette recorders.

What is claimed is:

1. A front panel fitting apparatus in which a pair of left and right leg parts, which are provided on either side of the underside of a plastic front panel that is arranged in a front opening portion of a bottom chassis having an electrical apparatus inside thereof, have respectively: leg bottom plates formed integrally with said front panel and extending to under said bottom chassis; and leg edge plates formed integrally with said respective leg bottom plates from the front edge through the both side edges thereof, a pair of left and right engaging holes being formed on the underside of said front panel, engaging convex portions being provided at positions of said bottom chassis opposing said respective engaging holes in a protruding manner, said front panel fitting apparatus being adapted in such a manner that the upper edge part of said front panel is engaged with a projecting portion on a crossbeam installed on the front side or in the upper front part of said bottom chassis, and then said front panel is rotated downward centering on said projecting portion to engage said engaging holes with said respective engaging convex portions, wherein a pair of slits are formed at a predetermined spacing forward from the central part of the rear edge of each of said leg bottom plates and an engaging hole is formed in an elastically deformable tongue piece left between said both slits, the rear edge of said tongue piece being retracted forward relative to the rear edge of each of said leg bottom plates by a predetermined spacing, and the upper angled portion of the rear edge of said tongue piece being clipped to form a concave groove.

2. A front panel fitting apparatus in which a pair of left and right engaging holes are formed on the underside of a plastic front panel that is arranged in a front opening portion of a bottom chassis having an electrical apparatus inside thereof and engaging convex portions are provided at positions of said bottom chassis opposing said respective engaging holes in a protruding manner, said front panel fitting apparatus being adapted in such a manner that the upper edge part of said front panel is engaged with a projecting portion on a crossbeam installed on the front side or in the upper front part of said bottom chassis, and then said front panel is rotated downward centering on said projecting portion to engage said engaging holes with said respective engaging convex portions, wherein a pair of left and right leg parts provided on the underside of said front panel have respectively: leg bottom plates formed integrally with said front panel and extending to under said bottom chassis; and leg edge plates formed integrally with said respective leg bottom plates from the front edge through the both side edges thereof, a pair of slits being formed at a predetermined spacing forward from the central part of the rear edge of each of said leg bottom plates, and an engaging hole being formed in an elastically deformable tongue piece left between said both slits.

3. The front panel fitting apparatus according to claim 2, wherein the rear edge of said tongue piece is retracted forward relative to the rear edge of each of said leg bottom plates by a predetermined spacing.

4. The front panel fitting apparatus according to claim 2 wherein the upper angled portion of the rear edge of said tongue piece is clipped to form a concave groove.

5. The front panel fitting apparatus according to claim 3, wherein the upper angled portion of the rear edge of said tongue piece is clipped to form a concave groove.

* * * * *